(12) United States Patent
Mun

(10) Patent No.: US 11,538,910 B2
(45) Date of Patent: Dec. 27, 2022

(54) FIELD-EFFECT TRANSISTORS OF SEMICONDUCTOR DEVICES

(71) Applicant: GLOBALFOUNDRIES Singapore Pte. Ltd., Singapore (SG)

(72) Inventor: Bong Woong Mun, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 141 days.

(21) Appl. No.: 16/819,169

(22) Filed: Mar. 16, 2020

(65) Prior Publication Data

US 2021/0288153 A1 Sep. 16, 2021

(51) Int. Cl.
*H01L 29/40* (2006.01)
*H01L 21/765* (2006.01)
*H01L 29/66* (2006.01)
*H01L 29/78* (2006.01)

(52) U.S. Cl.
CPC ......... *H01L 29/404* (2013.01); *H01L 21/765* (2013.01); *H01L 29/66681* (2013.01); *H01L 29/7816* (2013.01)

(58) Field of Classification Search
CPC ........... H01L 29/7816; H01L 29/66681; H01L 29/402
See application file for complete search history.

(56) References Cited

U.S. PATENT DOCUMENTS

| 2013/0020632 | A1* | 1/2013 | Disney | ................ H01L 29/0847 257/E21.409 |
| 2013/0277741 | A1 | 10/2013 | Zhang et al. | |
| 2016/0149033 | A1 | 5/2016 | Ito | |
| 2019/0088777 | A1* | 3/2019 | Lu | ..................... H01L 29/66659 |
| 2019/0288112 | A1* | 9/2019 | Wang | .................. H01L 29/7816 |

\* cited by examiner

*Primary Examiner* — Mohammed R Alam
(74) *Attorney, Agent, or Firm* — David Cain

(57) ABSTRACT

A semiconductor device is provided, which includes a substrate, a first and second doped wells, a drain and source regions, a gate structure, a field plate and a booster plate. The first and second doped wells are arranged in the substrate. The drain region is arranged in the first doped well and the source region is arranged in the second doped well. The gate structure is arranged over the substrate and between the source and drain regions. The field plate is arranged over the first doped well and the booster plate arranged between the field plate and the first doped well.

12 Claims, 7 Drawing Sheets

FIELD-EFFECT TRANSISTORS OF SEMICONDUCTOR DEVICES

FIELD OF THE INVENTION

The disclosed subject matter relates generally to semiconductor devices, and more particularly to field-effect transistors having improved electrical performance and methods of forming the same.

BACKGROUND

Semiconductor devices play many roles in modern society, including a crucial role in the conditioning and distribution of power and energy in the world. Such semiconductor devices include a type of field-effect transistors that are designed to handle significant power levels. These transistors can be found in systems delivering as little as a few tens of milliwatts for a headphone amplifier, up to around a gigawatt in a high-voltage direct current transmission line.

With technological advances in the semiconductor industry driving a need for continuous improvements to semiconductor devices, field-effect transistors having improved electrical performance are desired.

SUMMARY

To achieve the foregoing and other aspects of the present disclosure, field-effect transistors of semiconductor devices and methods of forming the same are presented.

According to an aspect of the present disclosure, a semiconductor device is provided, which includes a substrate, a first and second doped wells, a drain and source regions, a gate structure, a field plate, and a booster plate. The first and second doped wells are arranged in the substrate. The drain region is arranged in the first doped well and the source region is arranged in the second doped well. The gate structure is arranged over the substrate and between the source and drain regions. The field plate is arranged over the first doped well and the booster plate arranged between the field plate and the first doped well.

According to another aspect of the present disclosure, a method of forming a semiconductor device is provided, which includes providing a substrate and forming a first doped well in the substrate. A second doped well is formed in the substrate. A source region is formed in the first doped well and a drain region is formed in the second doped well. A gate structure is formed arranged over the substrate and arranged between the source and drain regions. A booster plate is formed over the first doped well and a field plate is formed over the booster plate.

BRIEF DESCRIPTION OF THE DRAWINGS

The embodiments of the present disclosure will be better understood from a reading of the following detailed description, taken in conjunction with the accompanying drawings.

Figure 1A:
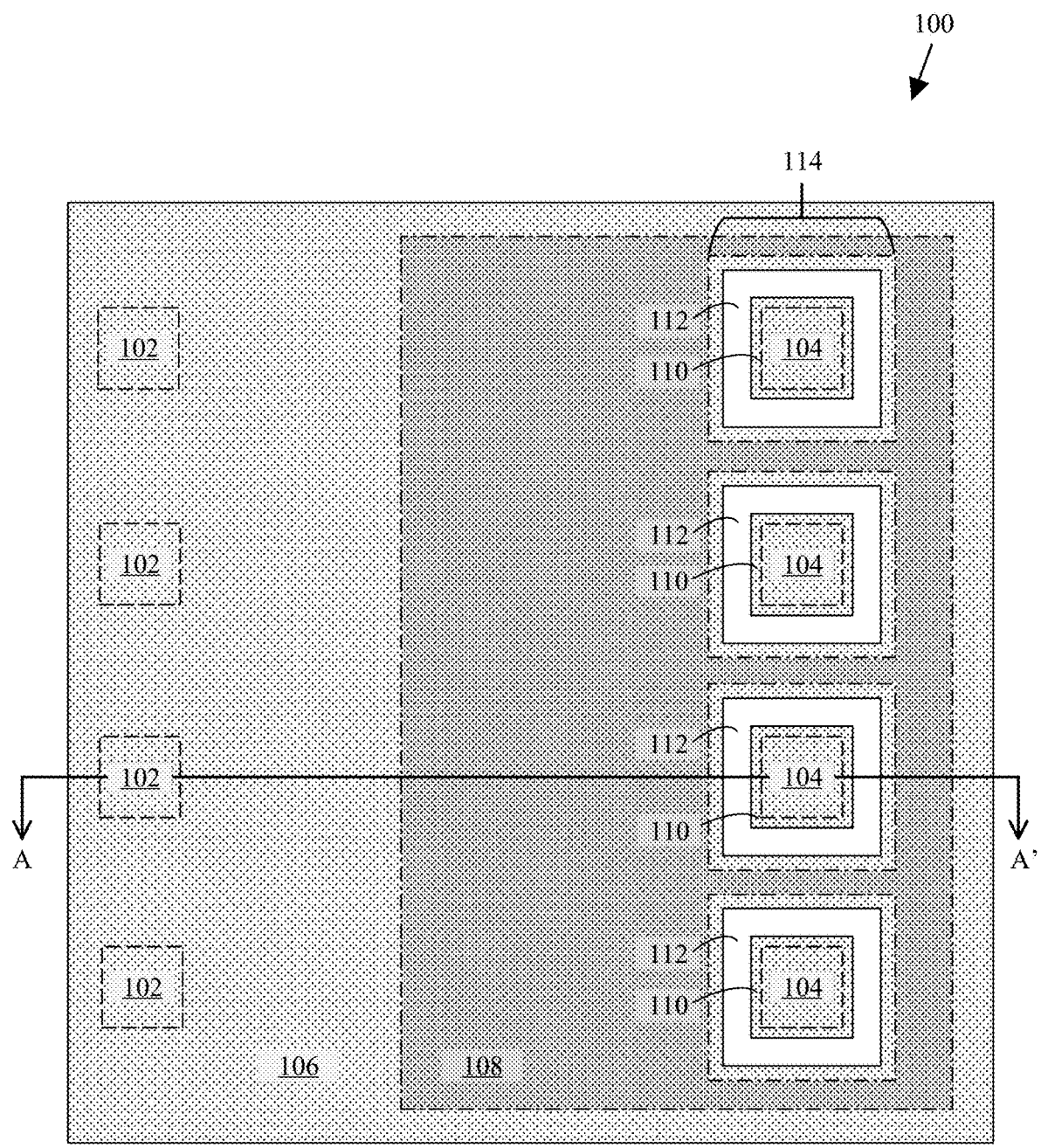
FIGS. 1A-1C are schematic plan views of a device, according to embodiments of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to field-effect transistors (FETs) having improved electrical performance and methods of forming the same. FETs may be designed to handle significant power levels and such FETs are preferably configured to have a high breakdown voltage. An ideal FET is one that can operate close to a theoretical breakdown voltage of the FET.

At a high drain voltage condition, a drain region of the FET will be substantially depleted of charge carriers, thereby increasing the breakdown voltage of the FET. The breakdown voltage of the FET may be further increased when a drain extension region is arranged between the drain region and a gate structure of the FET. The drain extension region advantageously reduces the surface electric field around the drain region, thereby increasing the breakdown voltage of the FET. An example of a FET having a drain extension region is an extended drain metal-oxide-semiconductor (EDMOS) FET.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

Figure 1B:
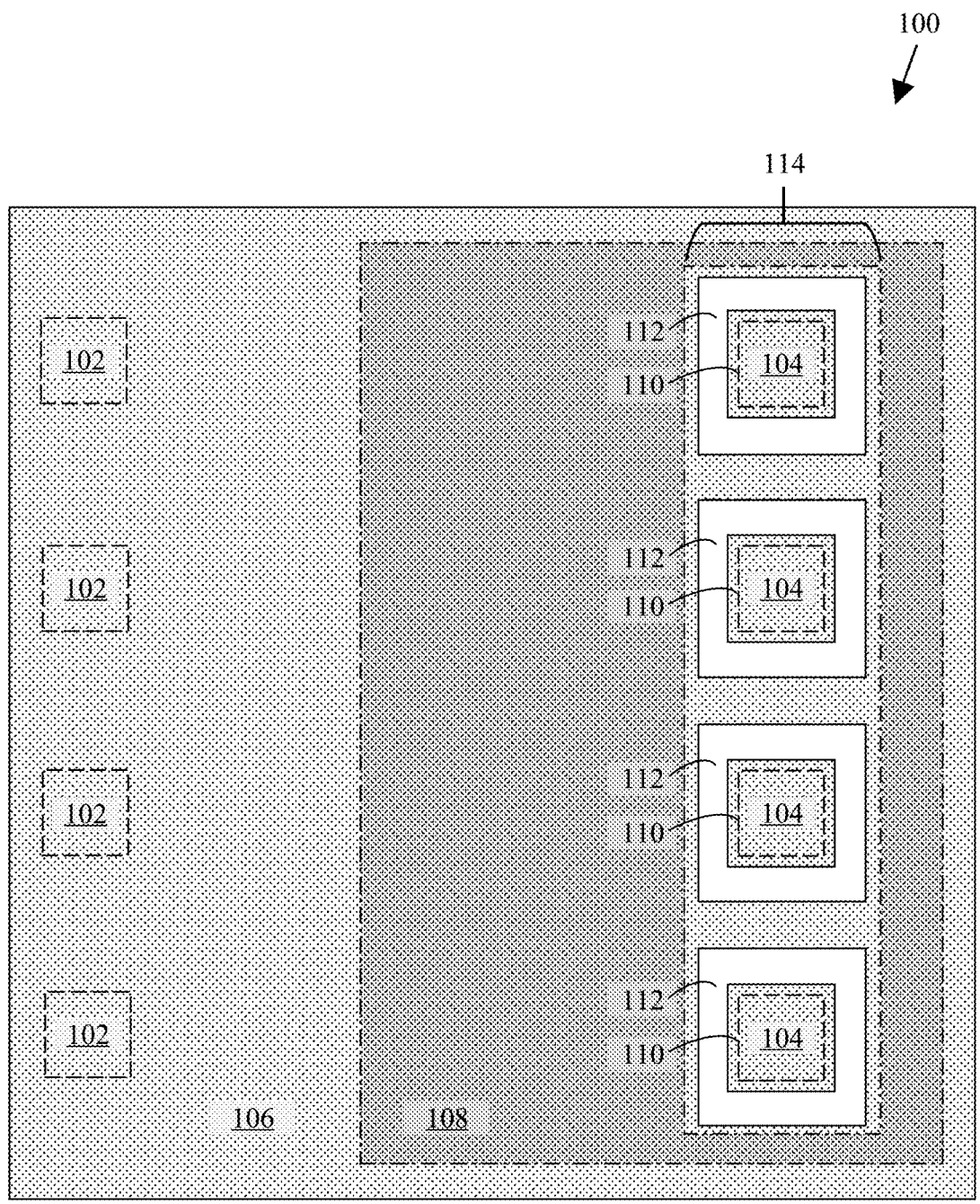
Figure 1C:
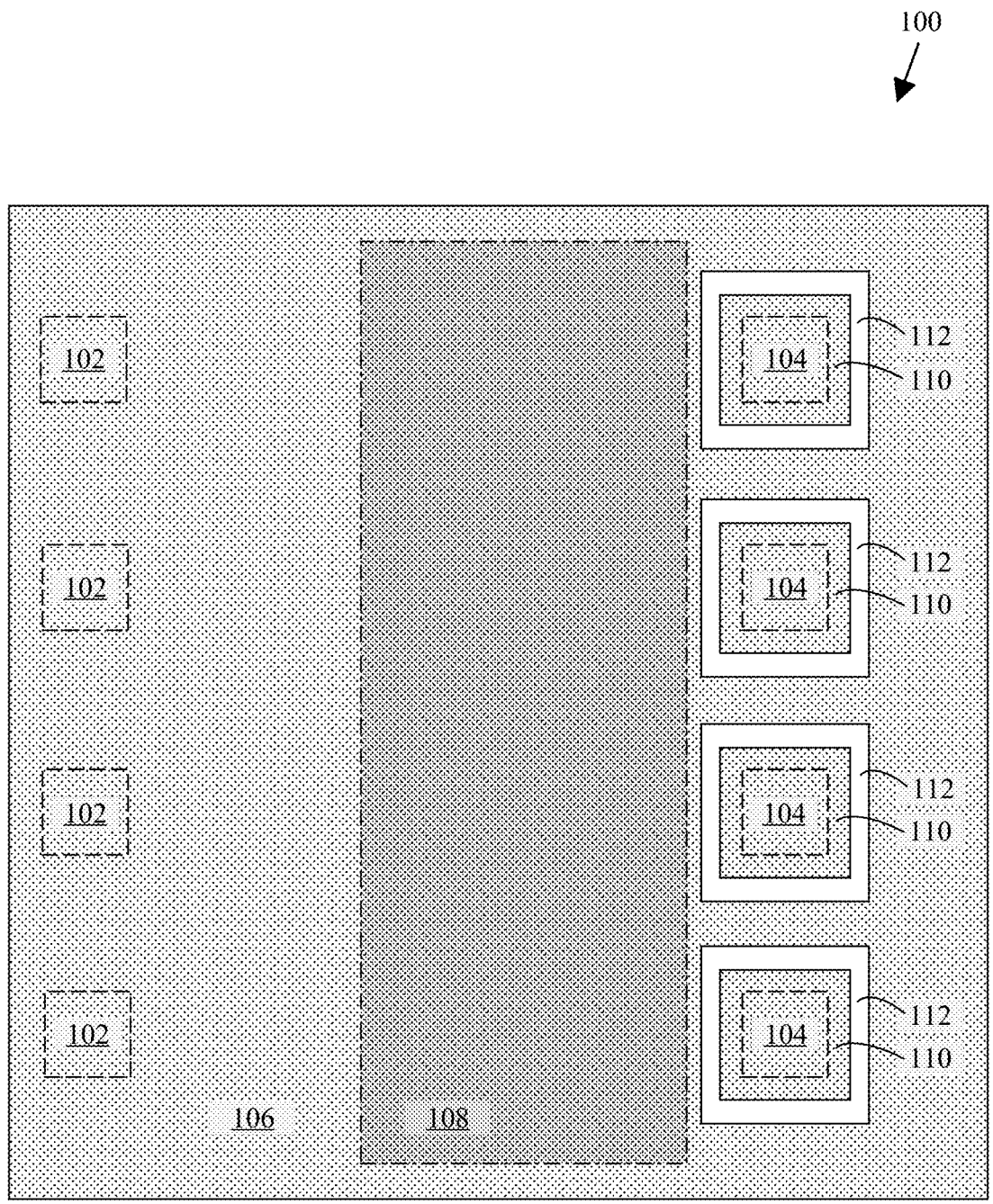

FIGS. 1A-1C are schematic plan views of a device 100, according to embodiments of the disclosure. The device 100 may be part of a semiconductor integrated circuit (IC) device. As illustrated, the device 100 may include a plurality of conductive features such as a plurality of source contacts 102, a plurality of drain contacts 104, a field plate 106, a booster plate 108, and a plurality of conductive structures 110. In an embodiment of the disclosure, the device 100 may include a plurality of FETs (not shown) arranged therein. In another embodiment of the disclosure, the device 100 may include a plurality of FETs having extended drain regions arranged therein.

The plurality of source contacts 102 and the plurality of drain contacts 104 may be conductively coupled to a plurality of source regions (not shown) and a plurality of drain regions (not shown), respectively.

Although the plurality of source contacts 102 and the plurality of drain contacts 104 are illustrated as having the same size or configuration, it is understood that the source contacts 102 and drain contacts 104 need not be of the same size or configuration. The number and configuration of the source contact 102 and drain contact 104 may vary depending on the design requirements of the semiconductor device.

The field plate 106 may be arranged over and conductively coupling the plurality of source contacts 102; the source contacts 102 are outlined with dashed lines to facilitate understanding. The plurality of conductive structures 110 may be arranged over and conductively coupling each of the drain contacts 104; the drain contacts 104 are outlined with dashed lines to facilitate understanding.

The field plate 106 is conductively isolated from the plurality of conductive structures 110 by having openings 112 formed therein. The field plate 106 and the plurality of conductive structures 110 may be a part of an interconnect structure to provide electrical connections with other semiconductor devices, such as logic or memory devices, although those semiconductor devices are not illustrated in the accompanying drawings.

The field plate 106 and the plurality of source contacts 102 may be conductively coupled to a relatively lower voltage while the plurality of drain contacts 104 and the plurality of conductive structures 110 may be conductively coupled to a relatively higher voltage so to effect an electrical potential difference between them.

The booster plate 108 may conductively couple the field plate 106 and arranged such that the booster plate 108 underlies the field plate 106; the booster plate 108 is outlined with a dash-dot line to facilitate understanding. In an embodiment of the disclosure, the booster plate 108 may underlie the field plate 106 over a drain extension region in the device region 100.

In the embodiment as illustrated in FIG. 1A, the booster plate 108 may have a plurality of openings 114 arranged therein; each of the plurality of openings 114 surrounds each drain contact 104 and their respective conductive structure 110. The drain contacts 104 and their respective conductive structures 110 are conductively isolated from the booster plate 108.

In an alternative embodiment as illustrated in FIG. 1B, the booster plate 108 may underlie the field plate 106 and may have the opening 114 arranged therein. The opening 114 may surround the plurality of drain contacts 104 and the plurality of conductive structures 110 such that the plurality of drain contacts such that the plurality of conductive structures 110 are conductively isolated from the booster plate 108.

In another alternative embodiment as illustrated in FIG. 1C, the booster plate may underlie the field plate 106 and may not have opening/s arranged therein.

In yet another alternative embodiment of the disclosure, the opening/s 114 in the booster plate 108 may not completely surround the plurality of drain contacts 104 and the plurality of the conductive structures 110.

It is understood that the above disclosed embodiments of the booster plate 108 in FIGS. 1A-1C are just some of the possible configurations of the booster plate 108 that is configured to conductively isolate the booster plate 108 from the plurality of drain contacts 104 and the plurality of conductive structures 110. The booster plate 108 may take on other configurations without departing from the spirit and scope of the present disclosure.

Figure 2A:
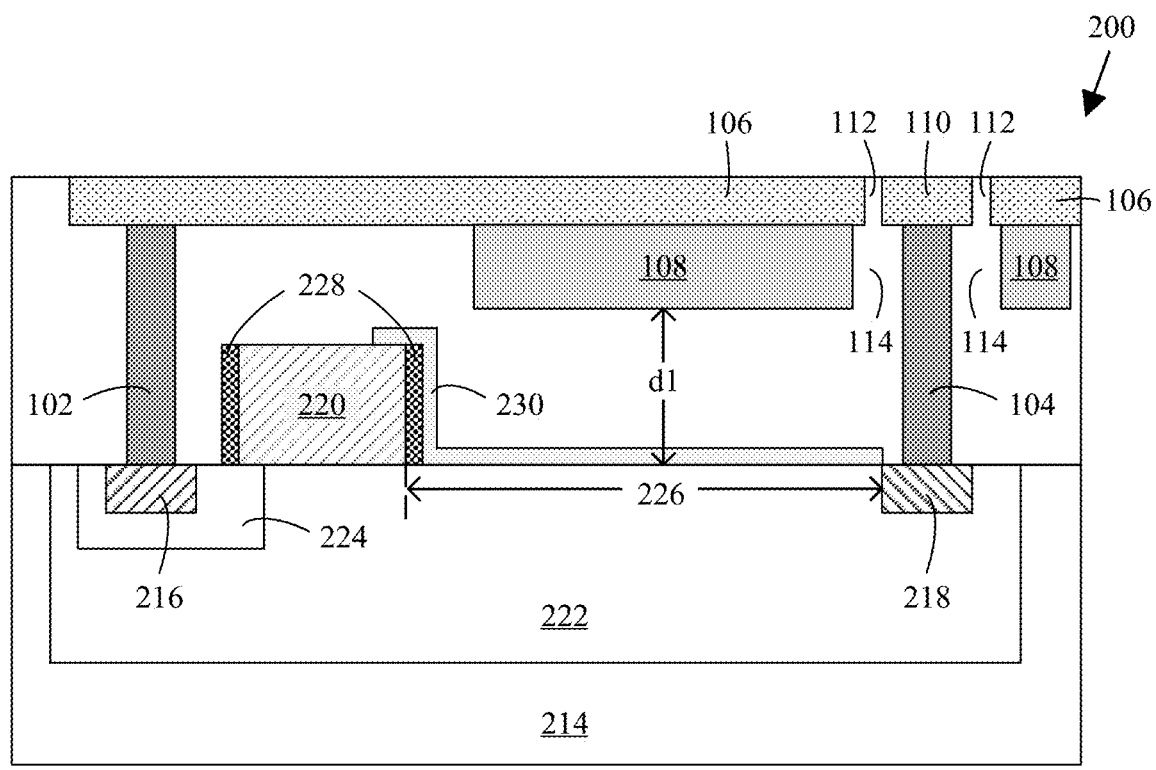
FIGS. 2A-2B are cross-sectional views of a device (taken along a line A-A' in FIG. 1), according to embodiments of the disclosure.
Figure 2B:
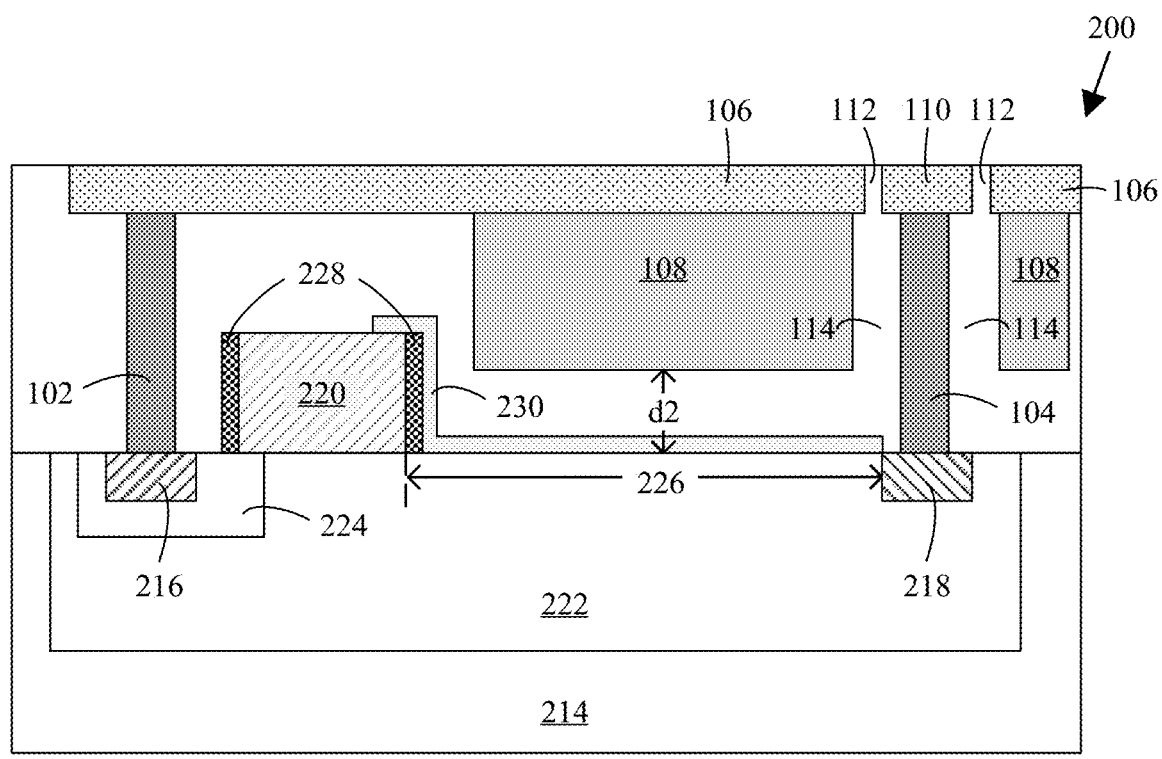

FIGS. 2A-2B are schematic cross-sectional views of a device 200 (taken along a similar line A-A' in FIG. 1A), according to an embodiment of the disclosure. The device 200 may be part of a semiconductor integrated circuit (IC) device. The device 200 may reside in a device region of a semiconductor device. The device region may include a plurality of devices and only one device is illustrated for clarity purposes. In an embodiment of the disclosure, the device 200 may include a FET.

The device 200 may include a substrate 214. The substrate 214 may include any semiconductor material such as, but not limited to, silicon, germanium, silicon germanium, silicon carbide, other II-VI or III-V semiconductor compounds. The substrate 214 may have an amorphous, a polycrystalline, or a monocrystalline structure. The substrate may be a bulk substrate or a multi-layered substrate.

Although not shown in the accompanying drawings, isolation regions may be provided for isolating or separating different regions of the substrate 214. For example, the isolation regions may include shallow trench isolation (STI) regions, deep trench isolation (DTI), or the like.

The device 200 may include a source region 216, a drain region 218, and a gate structure 220. In an embodiment of the disclosure, the source region 216 and the drain region 218 may be arranged in the substrate 214. In another embodiment of the disclosure, the source region 216 and the drain region 218 may be formed over a top surface of the substrate 214. Although the source region 216 and the drain region 218 are illustrated to have the same form, it is understood that the forms of the source region 216 and the drain region 218 may vary depending on the technology node and design requirements of the device 200.

The gate structure 220 may be arranged over the substrate 214. The gate structure 220 may include a plurality of elements such as, but not limited to, a gate electrode that is arranged over a gate dielectric layer, and these elements are not shown so as to not obscure the present disclosure.

Additionally, the gate structure 220 may be arranged between the source region 216 and the drain region 218 such that the drain region 218 is positioned further from the gate structure 220 than the source region 216 from the gate structure 216.

Furthermore, the substrate 214 may include a plurality of doped wells. The plurality of doped wells may have different dopant conductivity types, such as P-type or N-type conductivities, as well as different dopant depths and different dopant concentrations. P-type conductivity dopants may include, but not limited to, boron, aluminum, or gallium. N-type conductivity dopants may include, but not limited to, arsenic, phosphorus, or antimony. The dopant concentrations and/or dopant depths in the substrate 214, for example, may vary depending on the technology node and design requirements of the device 200.

The plurality of doped wells may include a first doped well 222 and a second doped well 224. The first doped well 222 may be arranged in the substrate 214 such that the source region 216 and the drain region 218 may be arranged therein. The first doped well 222 may serve as a drift well for the device 200 and may have a dopant depth depending on the design requirements of the device 200.

The second doped well 224 may be arranged within the first doped well 222 such that the source region 216 may be arranged within the second doped well 224. The second doped well 224 may be further arranged such that it partially underlaps the gate structure 220. The second doped well 224 may serve as a body well for the device 200, providing an electrical pathway for the diffusion of charges between the source region 216 and the gate structure 220. The second doped well 224 may have a dopant depth depending on the design requirements of the device 200.

In an alternative embodiment of the disclosure, the first doped well 222 may be spaced apart from the second doped well 224. In another alternative embodiment of the disclosure, the first doped well 222 may be arranged adjacent to the second doped well 224 such that the first doped well 222 and the second doped well 224 have adjoining edges. These alternative embodiments are not illustrated in the accompanying drawings. However, it is understood that these embodiments are contemplated as being applicable to all embodiments of the present disclosure.

The first doped well 222 and the second doped well 224 may have opposite conductivity types. For example, the first doped well 222 may have P-type conductivity and the second doped well 224 may have N-type conductivity or vice versa. In an embodiment of the disclosure, the first doped well 222 has the same conductivity type as the source region 216 and the drain region 218.

The first doped well 222 may include a drain extension region 226, according to an embodiment of the disclosure. The drain extension region 226 may serve to provide an electrical pathway for the diffusion of charges between the drain region 218 and the gate structure 220. The drain extension region 226 may be arranged between the drain region 218 and the gate structure 220 and may have a length substantially corresponding to a distance between the gate structure 220 and the drain region 218. For example, the drain extension region 226 may have a length from an edge of the drain region 218 proximal to the gate structure 220 to a sidewall of the gate structure 220 proximal to the drain region 218. The length of the drain extension region 226 may vary depending on the design requirements of the device 200.

Spacers 228 may be arranged on the sidewalls of the gate structure 220 respectively. The spacers 228 may include a dielectric material such as, but not limited to, silicon oxide, silicon nitride, or the like.

An insulation layer 230 may be conformally arranged on the spacer 228 that is proximal to the drain region 218. The insulation layer 230 may partially overlap a top surface of the gate structure 220 and may laterally extend to cover the drain extension region 226. The insulation layer 230 may be a single-layered dielectric material or a multi-layered dielectric material. For example, the single-layered insulation layer 230 may include silicon oxide. In another example, the multi-layered insulation layer 230 may include a first silicon oxide layer, a silicon nitride layer arranged over the first silicon oxide layer, and a second silicon oxide layer arranged over the silicon nitride layer.

In an embodiment of the disclosure, the insulation layer 230 may serve to prevent salicidation of the substrate 214 between the gate structure 220 and the drain region 218.

Contacts may be arranged over the substrate 214. A source contact 102 may be arranged over the source region 216 and a drain contact 104 may be arranged over the drain region 218. The contacts may serve to provide electrical connections with other semiconductor devices, such as logic or memory devices, although those semiconductor devices are not illustrated in the accompanying drawings. The contacts may include conductive materials such as tungsten, although other conductive materials known in the art may be employed. In an embodiment of the disclosure, a gate contact may be arranged over the gate structure 220 at a region not covered by the insulation layer 230, although the gate contact is not illustrated in FIG. 2A.

The device 200 may include a field plate 106 that is conductively coupled to the source contact 102. The field plate 106 may extend over the gate structure 220 and the drain extension region 226. A conductive structure 110 may be arranged over the drain contact 104. Although the conductive structure 110 is illustrated to be arranged at the same level as the field plate 106, the conductive structure 110 may be arranged in a different configuration depending on the design requirements of the device 200. The field plate 106 and the conductive structure 110 are spaced apart so as to avoid electrical shorting between the field plate 106 and the conductive structure 110. The field plate 106 and the conductive structure 110 may include the same conductive material as the source contact 102. The conductive material may include, but not limited to, copper or aluminum, although other conductive materials known in the art may be employed.

During operation of the device 200, surface electric fields may be generated in the first doped well 222 by the source region 216 and the drain region 218. As the source region 216 and the drain region 218 have the same conductivity type, the generated surface electric fields repel each other. The field plate 106 may enhance the surface electric field generated by the source region 216, thereby further repelling the surface electric field generated by the drain region 218. The surface electric field generated in the drain extension region 226 may be advantageously reduced. By reducing the surface electric field in the drain extension region 226, the device 200 may achieve a desirable high breakdown voltage having improved electrical performance.

The device 200 may additionally include a booster plate 108. The booster plate 108 may be arranged underlying the field plate 106. The booster plate 108 may be conductively coupled to the field plate 106 and arranged over the drain extension region 226. The booster plate 108 may include a conductive material such as, tungsten, although other conductive materials known in the art may be employed.

In an embodiment of the disclosure, the booster plate 108 may have an opening 114 formed therein. The opening 114 may be arranged over the drain region 218. The drain contact 104 may be arranged through the opening 114 such that the drain contact 104 is conductively isolated from the booster plate 108.

As illustrated in FIG. 2A, the booster plate 108 and the drain extension region 226 may have a separation distance d1. The booster plate 108 further enhances, or boosts, the surface electric field generated by the source region 216 during the operation of the device 200, advantageously enabling the device 200 to achieve a higher breakdown voltage, thereby realizing better electrical performance.

The difference between the embodiments of device 200 in FIG. 2A and FIG. 2B lies in the thickness of the booster plate 108. As illustrated in FIG. 2B, the booster plate 108 has a thickness greater than that of the booster plate 108 in FIG. 2A. The separation distance d2 between the booster plate 108 and the drain extension region 226 is, therefore, narrower than that of the separation distance d1 in FIG. 2A.

As the separation distance between the booster plate 108 and the drain extension region 226 influences the strength of the surface electric field generated, the thicker the booster plate 108, and therefore the narrower the separation distance between the booster plate 108 and the drain extension region 226, the stronger the surface electric field generated by the source region 216 to repel the surface electric field generated in the drain extension region 226 by the drain region 218. The thickness of the booster plate 108 may be adjusted to achieve the desired values of breakdown voltage and/or a desirable level of electrical performance.

Figure 3:
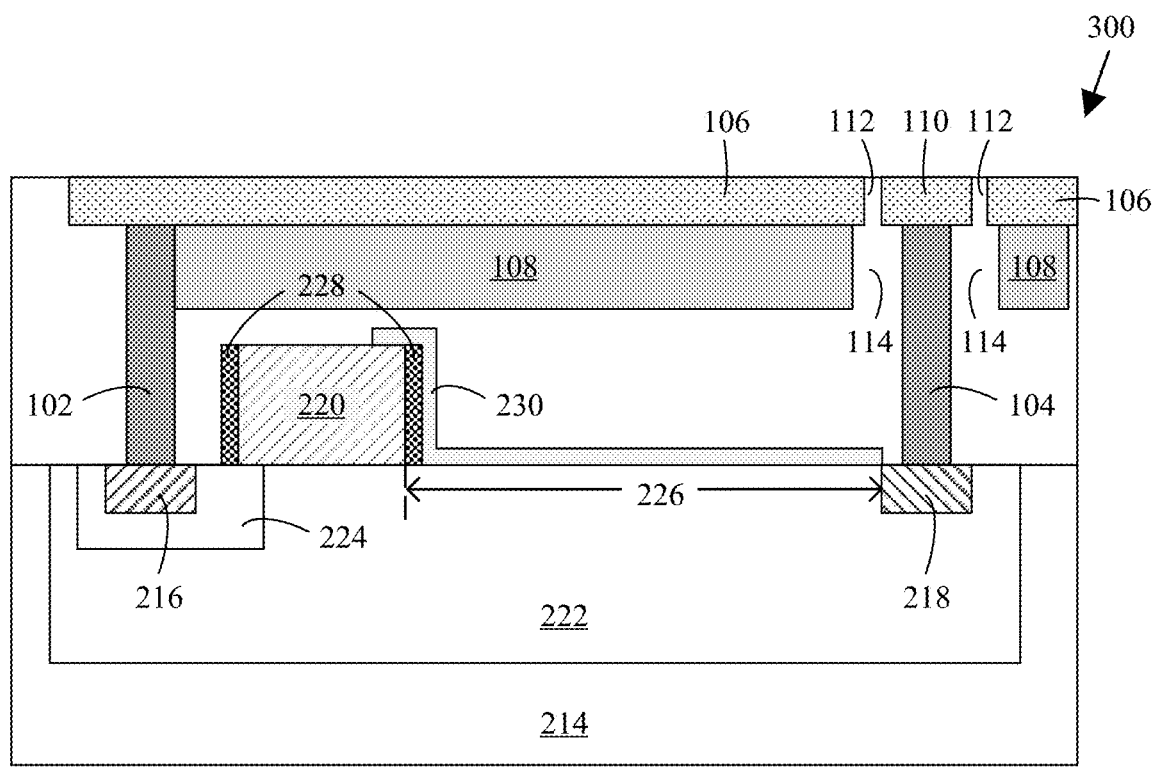
FIG. 3 is a cross-sectional view of a device (taken along a line A-A' in FIG. 1), according to an embodiment of the disclosure.

FIG. 3 is a schematic cross-sectional view of a device 300 (taken along a similar line A-A' in FIG. 1A), according to an embodiment of the disclosure. Similarly to the embodiments of the device 200 in FIGS. 2A-2B, the device 300 may be part of a semiconductor integrated circuit (IC) device and the device 300 may reside in a device region of a semiconductor device. The device region may include a plurality of devices and only one device is illustrated for clarity purposes. In an embodiment of the disclosure, the device 300 may include a transistor, and more specifically, a FET having an extended drain region.

The difference between the embodiments of the device 200 in FIGS. 2A and 2B and the embodiment of the device 300 in FIG. 3 lies in the form of the booster plate 108. The booster plate 108 in FIG. 3 extends over the gate structure 220. Although the booster plate 108 is illustrated to be contacting the source contact 102, the booster plate 108 may not be contacting the source contact 102 in an alternative embodiment of the disclosure.

FIGS. 4A-4E are cross-sectional views of the device 200 (taken along the line A-A' in FIG. 1), illustrating a method of forming the device 200, according to an embodiment of the disclosure. Certain structures may be conventionally fabricated, for example, using known processes and techniques, and specifically disclosed processes and methods may be used to achieve individual aspects of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" includes deposition of material or photoresist, patterning, exposure, development, etching, cleaning, and/or removal of the material or photoresist as required in forming a described pattern, structure or opening. Exemplary examples of techniques for patterning include, but not limited to, wet etch lithographic processes, dry etch lithographic processes or direct patterning processes. Such techniques may use mask sets and mask layers with dopants having a desired conductivity type.

The term "doping techniques" as used herein refers to an intentional introduction of impurities, i.e., dopants, into an intrinsic semiconductor material to alter its property, for example, modulating its electrical, optical, and/or structural properties. Exemplary techniques for doping include, but not limited to, ion implantation or in-situ growth during epitaxial growth of semiconductor materials. Such techniques may use mask sets and mask layers.

Figure 4A:
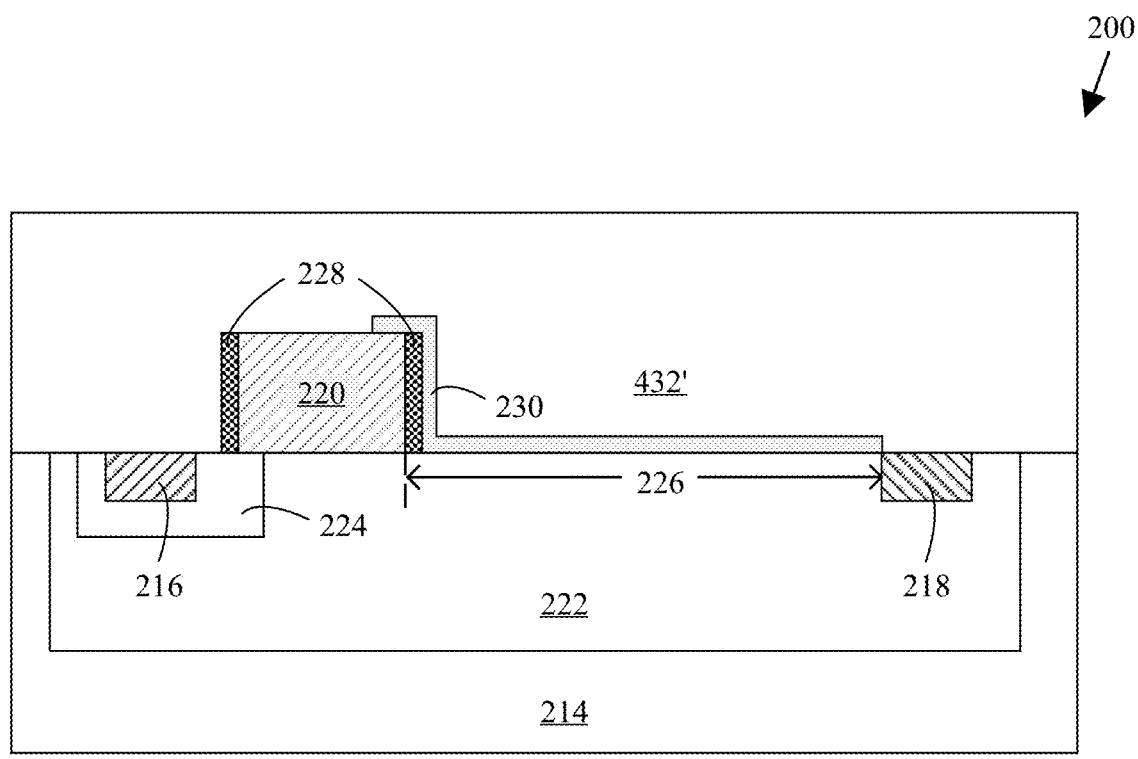
FIGS. 4A-4E are cross-sectional views of a device (taken along a line A-A' in FIG. 1), illustrating a method of fabricating the device, according to an embodiment of the disclosure.

FIG. 4A illustrates the device 200 after forming the plurality of doped wells (222 and 224), the source region 216, the drain region 218, the gate structure 220, the spacers 228, and the insulation layer 230, according to an embodiment of the disclosure.

The plurality of doped wells (222 and 224), the source region 216, and the drain region 218 may be formed by various doping techniques. The first doped well 222 may be formed by doping the substrate with dopants having a first conductivity type. The second doped well 224 may be subsequently formed introducing dopants having a second conductivity type. The source region 216 and the drain region 218 may be formed concurrently by introducing dopants having the first conductivity type into the second doped well 224 and the first doped well 222, respectively. The dopants in the source region 216 and the drain region 218 may or may not include the same type of dopants as the first doped well 222.

The gate structure 220, the spacers 228, and the insulation layer 230 may be formed by the various deposition and patterning techniques. Gate materials may be deposited and patterned to form the gate structure 220. The gate structure 220 may be formed over the substrate 214 between the source region 216 and the drain region 218.

The spacers 228 may be formed on sidewalls of the gate structure 220. It may be preferable to employ a conformal deposition process to form the spacers 228. The conformal deposition process may include, but not limited to, an ALD process or a highly-conformal CVD process to deposit a spacer material. The spacer material may be patterned to form the spacers 228.

The insulation layer 230 may be formed over the spacers 228. Similar to the fabrication process of the spacers 228, a conformal deposition process may be preferable to form the insulation layer 230. An insulating material may be deposited and patterned to form the insulation layer 230 that partially overlaps a top surface of the gate structure 220 and extends over first doped well 222 to a length substantially corresponding to the length of the drain extension region 226.

A first portion of dielectric layer 432' may be deposited over the substrate, covering the gate structure 220, the spacers 228, and the insulation layer 230. The dielectric layer 432' may include, but not limited to, silicon oxide or other dielectric materials known in the art.

Figure 4B:
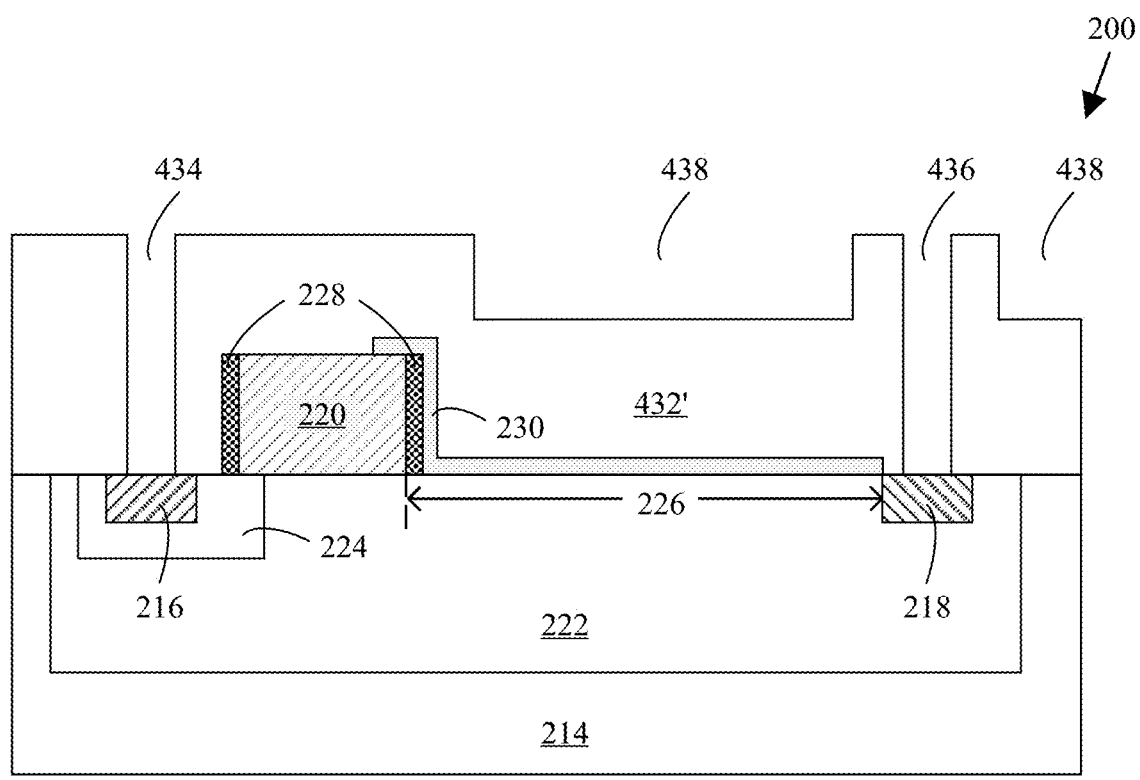

FIG. 4B illustrates the device 200 after forming a plurality of openings, including a source contact opening 434, a drain contact opening 436, and a booster plate opening 438 in the first portion of the dielectric layer 432', according to an embodiment of the disclosure. The openings may be formed using various patterning techniques.

The source contact opening 434 may be formed over the source region 216 and the drain contact opening 436 may be formed over the drain region 218. The booster plate opening 438 may be formed over the drain extension region 226 that is between the source contact opening 434 and the drain contact opening 436. Although the booster plate opening 438 appears to be discrete openings in FIG. 4B, the booster plate opening 438 is a single opening connected into and out of the plane of the drawings, as illustrated by the plan view of the embodiment of the booster plate 108 in FIG. 1.

Figure 4C:
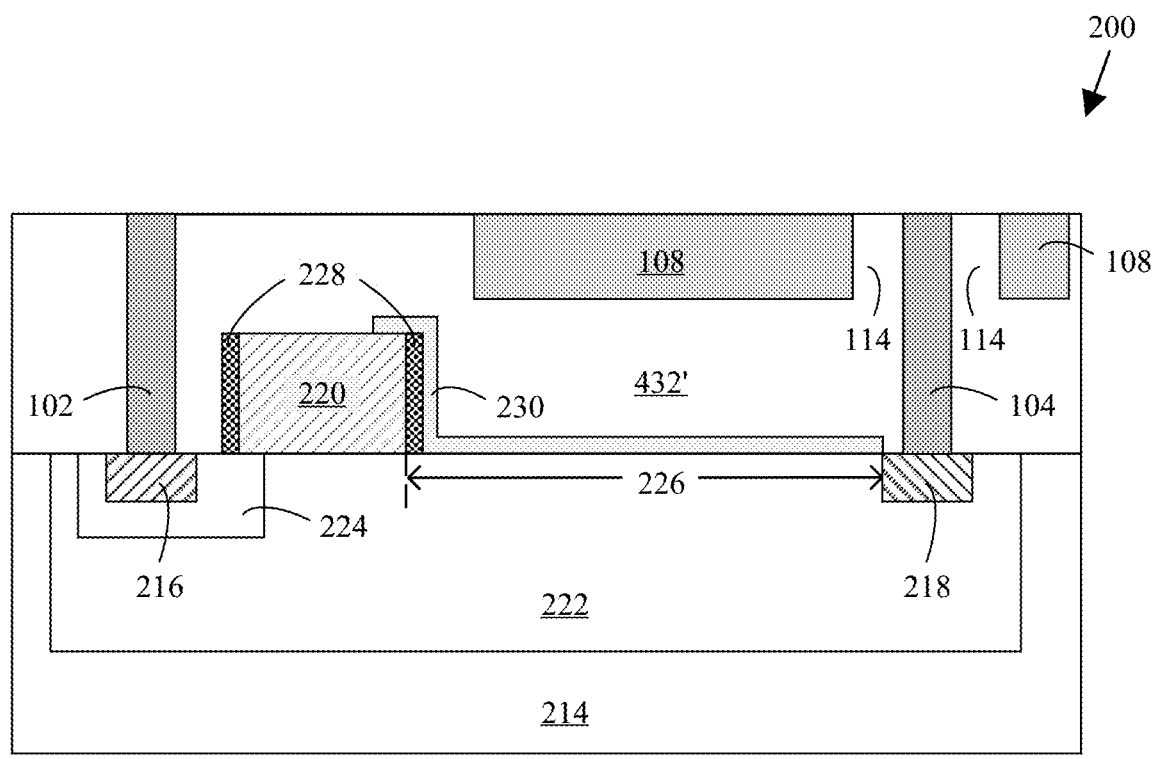

FIG. 4C illustrates the device 200 after filling the plurality of openings, according to an embodiment of the disclosure. The plurality of openings 434, 436, and 438 may be filled with a conductive material using a deposition technique to form a source contact 102, a drain contact 104, and a booster plate 108, respectively. The conductive material may include tungsten, although other conductive materials known in the art may be employed. A planarization process, such as a chemical mechanical planarization (CMP) process, may be employed to form the source contact 102, the drain contact 104, and the booster plate 108 having planar top surfaces. The booster plate has the opening 114 formed therein.

Figure 4D:
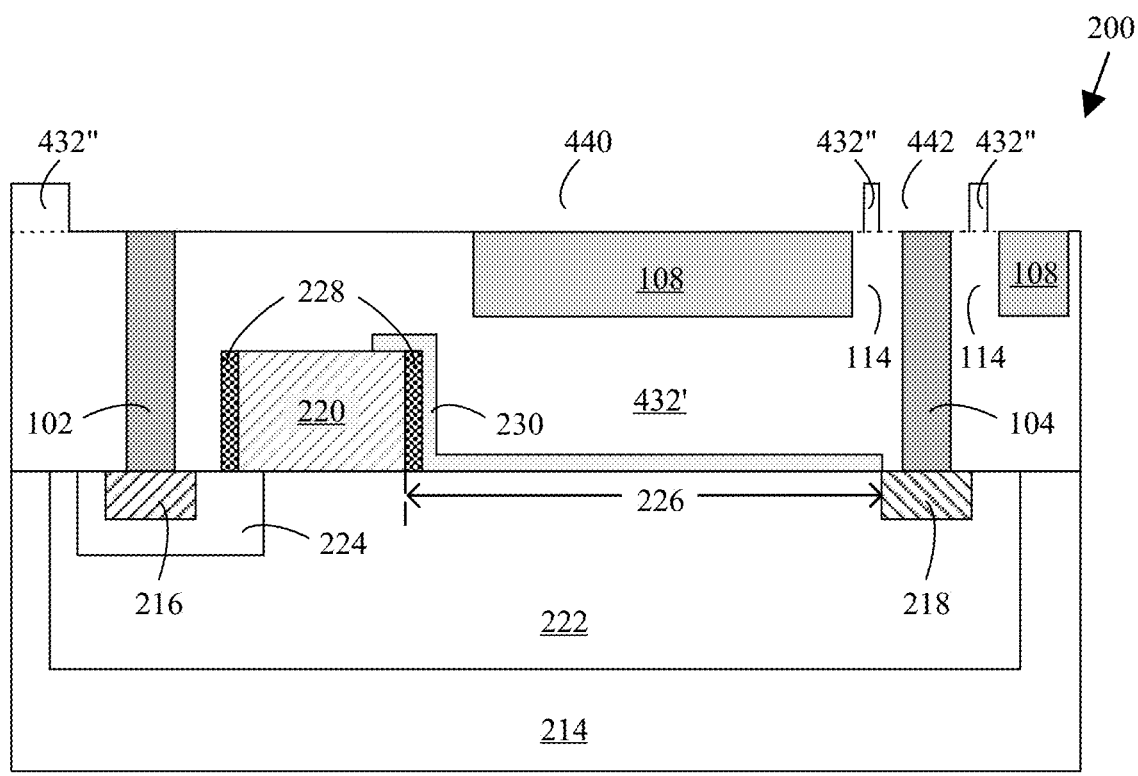

FIG. 4D illustrates the device 200 after forming a field plate opening 440 and a conductive structure opening 442, according to an embodiment of the disclosure. The field plate opening 440 and the conductive structure opening 442 may be formed using various patterning techniques.

A second portion of the dielectric layer 432" may be deposited over the device 200. The field plate opening 440 and the conductive structure opening 442 may be formed in the second portion of the dielectric layer 432". The field plate opening 440 may be arranged over the source contact 102 and the booster plate 108. The field plate opening 440 may be arranged overlying the booster plate 108. The conductive structure opening 442 may be arranged over the drain contact 104.

The second portion of the dielectric layer 432" may include the same dielectric material as the first portion of the dielectric layer 432' and the intersection between the first and second portions of the dielectric layer (432' and 432", respectively) is demarcated by a dotted line. It is understood that the second portion of the dielectric layer 432" may include a different dielectric material from the first portion of the dielectric layer 432', and any dielectric materials known in the art are contemplated as being applicable to all embodiments of the present disclosure. In an embodiment of the disclosure, the first and second portions of the dielectric layer (432' and 432", respectively) may serve as a pre-metal dielectric (PMD) layer for the device 200.

Figure 4E:
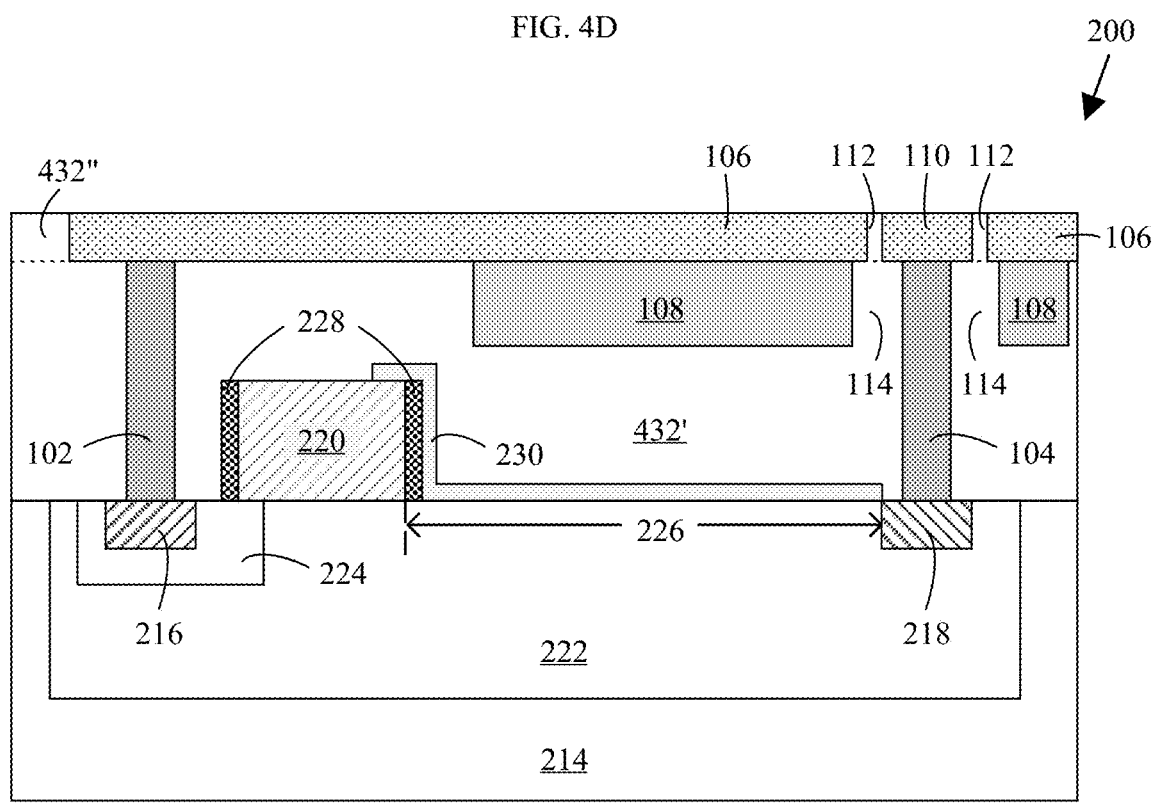

FIG. 4E illustrates the device 200 after forming a field plate 106 and a conductive structure 110, according to an embodiment of the disclosure. The field plate opening 440 and the conductive structure opening 442 may be filled with a conductive material using a deposition technique to form the field plate 106 and the conductive structure 110. The conductive material may include, but not limited to, copper or aluminum, although other conductive materials known in the art may be employed. A planarization process, such as a chemical mechanical planarization (CMP) process, may be employed to form the field plate 106 and the conductive structure 110 having planar top surfaces.

Although FIGS. 4A-4E illustrates a method of forming the device 200, as will be appreciated by those skilled in the art, other methods may be employed to form the device 200.

For example, the booster plate 108 may not necessarily be formed together with the source contact 102 and the drain contact 104. The booster plate 108 may be formed in the first portion of the dielectric layer 432', followed by concurrently forming the source contact 102, the drain contact 104, the field plate 106, and the conductive structure 110 after deposition of the second portion of the dielectric layer 432". The source contact 102, the drain contact 104, the field plate 106, and the conductive structure 110 may be concurrently formed using a dual damascene process.

In another example, the s source contact 102, the drain contact 104, the field plate 106, and the conductive structure 110, and the booster plate 108 may be formed concurrently after forming the respective openings and filling those respective openings with a conductive material.

As presented in the above disclosure, a device having improved electrical performance and methods of forming the same are presented. The device may be a FET, or more specifically, an EDMOS FET. The device may include a field plate and a booster plate arranged over a drain extension region. The drain extension region is arranged between a gate structure and a drain region, in a doped well arranged in a substrate. The booster plate enhances, or boosts, the surface electric field generated by the source region during the operation of the device, advantageously enabling the device to achieve a higher breakdown voltage, thereby realizing better electrical performance.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
 a substrate;
 a first doped well and a second doped well in the substrate;
 a drain region in the first doped well and a source region in the second doped well;
 a dielectric layer over the substrate;
 a gate structure in the dielectric layer and between the source region and drain region;
 a field plate over the first doped well;
 a booster plate having a planar structure with a uniform thickness between the field plate and the first doped well, wherein the booster plate is spaced apart from the first doped well by the dielectric layer; and
 an insulation layer between the substrate and the booster plate.

2. The semiconductor device of claim 1, further comprises a drain extension region in the first doped well, the drain extension region being located between the gate structure and the drain region.

3. The semiconductor device of claim 1, wherein the booster plate is conductively coupled to the field plate.

4. The semiconductor device of claim 1, wherein the booster plate is conductively coupled to the source region.

5. The semiconductor device of claim 1, wherein the booster plate has a greater thickness than the field plate.

6. The semiconductor device of claim 1, further comprises a source contact, the source contact being conductively coupled to the booster plate and the source region.

7. The semiconductor device of claim 1, wherein the booster plate comprises an opening.

8. The semiconductor device of claim 7, wherein the opening of the booster plate is arranged over the drain region.

9. The semiconductor device of claim 7, wherein a drain contact is arranged in the opening of the booster plate.

10. The semiconductor device of claim 1 wherein the insulation layer covers a drain extension region located between the gate structure and the drain region.

11. The semiconductor device of claim 1, wherein the first and second doped wells have different dopant conductivities.

12. The semiconductor device of claim 1, wherein the gate structure comprises an upper surface and the booster plate comprises a lower surface, and the lower surface of the booster plate is above the upper surface of the gate structure.

* * * * *